United States Patent
Abe et al.

(10) Patent No.: US 7,503,982 B2
(45) Date of Patent: Mar. 17, 2009

(54) METHOD FOR CLEANING SEMICONDUCTOR SUBSTRATE

(75) Inventors: Yumiko Abe, Saitama (JP); Norio Ishikawa, Saitama (JP)

(73) Assignee: Kanto Jangaku Kabushiki Kaisha, Chuo-Ku, Tokyo (JP)

( * ) Notice: Subject to any disclaimer, the term of this patent is extended or adjusted under 35 U.S.C. 154(b) by 261 days.

(21) Appl. No.: 10/818,033

(22) Filed: Apr. 5, 2004

(65) Prior Publication Data

US 2004/0204329 A1 Oct. 14, 2004

(30) Foreign Application Priority Data

Apr. 9, 2003 (JP) ............................. 2003-105728

(51) Int. Cl.
C23G 1/00 (2006.01)
C23G 1/02 (2006.01)

(52) U.S. Cl. ............................................. 134/2; 134/3

(58) Field of Classification Search ................. 510/175, 510/176, 477, 505, 506, 495; 134/2, 3
See application file for complete search history.

(56) References Cited

U.S. PATENT DOCUMENTS

| | | | | |
|---|---|---|---|---|
| 3,896,254 A * | 7/1975 | Berkner | ...................... | 428/446 |
| 5,833,761 A * | 11/1998 | Inada et al. | .................... | 134/10 |
| 5,872,088 A * | 2/1999 | Pucci et al. | ................. | 510/238 |
| 5,928,435 A * | 7/1999 | Berger | ............................ | 134/3 |
| 6,080,709 A | 6/2000 | Ishikawa et al. | ............ | 510/175 |
| 6,143,705 A | 11/2000 | Kakizawa et al. | ........... | 510/175 |
| 6,310,020 B1 | 10/2001 | Shirota et al. | ............... | 510/176 |
| 6,410,494 B2 | 6/2002 | Kakizawa et al. | ........... | 510/175 |
| 6,627,590 B1 * | 9/2003 | Sherry et al. | ................ | 510/238 |
| 6,696,399 B1 * | 2/2004 | Chernin et al. | .............. | 510/241 |
| 6,699,825 B2 * | 3/2004 | Rees et al. | ................... | 510/180 |
| 6,730,644 B1 * | 5/2004 | Ishikawa et al. | ............ | 510/175 |
| 6,825,156 B2 * | 11/2004 | Lee et al. | ..................... | 510/176 |
| 6,914,039 B2 * | 7/2005 | Ishikawa et al. | ............ | 510/176 |
| 7,084,097 B2 * | 8/2006 | Ishikawa et al. | ............ | 510/175 |
| 7,138,362 B2 * | 11/2006 | Abe et al. | .................... | 510/175 |
| 7,144,848 B2 * | 12/2006 | Zhou et al. | .................. | 510/175 |
| 2002/0011255 A1 * | 1/2002 | Gonzales et al. | ............ | 134/1.3 |
| 2002/0068684 A1 | 6/2002 | Peters et al. | ................ | 510/175 |
| 2003/0130147 A1 | 7/2003 | Koito et al. | .................. | 510/175 |
| 2006/0166846 A1 * | 7/2006 | Li et al. | ...................... | 510/175 |

FOREIGN PATENT DOCUMENTS

| | | |
|---|---|---|
| CH | 122023 | 8/1926 |
| EP | 1 047 121 A1 | 10/2000 |
| EP | 1047121 A1 * | 10/2000 |
| EP | 1 365 013 A1 | 11/2003 |
| EP | 1 544 324 A1 | 6/2005 |
| JP | 358032669 A * | 2/1983 |
| JP | 10-72594 | 3/1998 |
| JP | 11-131093 | 5/1999 |
| JP | 2000-206709 | 7/2000 |
| JP | 2001-007071 | 1/2001 |
| JP | 2002041393 | 2/2008 |
| WO | WO 03/065433 A1 | 8/2003 |

OTHER PUBLICATIONS

Database WPI—Section Ch, Week 199106, Derwent Publications Ltd., London, GB; 1990 XP-002287119.

* cited by examiner

*Primary Examiner*—Lorna M Douyon
(74) *Attorney, Agent, or Firm*—Licata & Tyrrell P.C.

(57) ABSTRACT

A method for cleaning a semiconductor substrate having a contact angle between the surface thereof and water dropped thereon of at least 70 degrees comprises contacting the semiconductor surface with a cleaning liquid composition including an aliphatic polycarboxylic acid, an organic solvent having a hydroxyl group and/or an ether group, an anionic surfactant and water.

2 Claims, No Drawings

US 7,503,982 B2

METHOD FOR CLEANING SEMICONDUCTOR SUBSTRATE

This application claims the benefit of priority of Japanese Application Serial No. 2003-105728 filed Apr. 9, 2003, which is herein incorporated by reference in its entirety.

BACKGROUND OF THE INVENTION

1. Field of the Invention

The present invention relates to a cleaning liquid composition used for cleaning a semiconductor substrate and, in particular, it relates to a cleaning liquid composition suitable for removing particulate contamination and metallic contamination adsorbed on the surface of a hydrophobic substrate such as bare silicon or a low dielectric constant (Low-K) film.

2. Description of Related Art

Accompanying the increasing integration of ICs, there is a demand for strict contamination control since trace amounts of impurities greatly influence the performance and yield of a device. That is, strict control of particulate contamination and metallic contamination on a substrate is required, and cleaning with various types of cleaning liquids is therefore carried out at each step in semiconductor production.

With regard to cleaning liquids generally used for semiconductor substrates, ammonia-hydrogen peroxide-water (SC-1), which is an alkaline cleaning liquid, is used for removing particulate contamination, and sulfuric acid-hydrogen peroxide, hydrochloric acid-hydrogen peroxide-water (SC-2), dilute hydrofluoric acid, etc., which are acidic cleaning liquids, are used for removing metallic contamination, and the cleaning liquids are used singly or in combination according to the intended purpose.

On the other hand, accompanying advances of the increasing integration of ICs and making them with multilayer wiring structures, the substrate surface is required to be made more strictly planar in each process, and as a new technique the chemical-mechanical polishing technique (hereinafter called CMP) has been introduced into the semiconductor production process. In this technique, the surface of the substrate is polished and planarized by means of a rotating buff while supplying a mixed slurry of abrasive particles and a chemical agent. At the same time, materials constituting the surface of the substrate that is planarized have been changing. As a result, post-CMP substrate surfaces are contaminated by particulate contamination originating from alumina or silica contained in the abrasive and various types of metallic contamination originating from the constituents of the surface that is polished and the chemical agent contained in the slurry. In order to remove this contamination, brush-cleaning, which involves both the chemical effect of a cleaning liquid and the physical effect of brushing, is carried out as general post-CMP cleaning, and as the cleaning liquid used here an appropriate cleaning liquid is selected from various types of cleaning liquids while taking into consideration the properties of the constituents of the surface of the substrate and the contamination.

In the case where the surface of a substrate to which CMP is applied is a conventional $SiO_2$ interlayer insulating film, two stage cleaning has been carried out, and this employs the alkaline cleaning liquid for removing particulate contamination and the acidic cleaning liquids for removing metallic contamination.

However, in the case of interlayer insulating films used in recent years, in which a metal material such as Cu or W is exposed as a via-hole or a wiring material, the acidic cleaning liquids will corrode the metal material or are unable to remove the metallic contamination adequately within a time in which no corrosion occurs. The alkaline cleaning liquids also cause problems such as corrosion of Cu. As a method for solving these problems, an aqueous solution containing an organic acid and a complexing agent has been proposed as a cleaning liquid for metallic contamination (JP, A, 10-72594 and JP, A, 11-131093), and a cleaning liquid containing an organic acid and a complexing agent has been proposed as a technique for simultaneously removing metallic contamination and particulate contamination (JP, A, 2001-7071).

Furthermore, in recent years attempts have been made to use, as interlayer insulating films, an organic film such as an aromatic aryl polymer (SiLK, Dow Chemical) having lower dielectric constant than that of the conventional $SiO_2$ system, a silicon-based film such as MSQ (Methyl Silsesquioxane), HSQ (Hydrogen Silsesquioxane) or SiOC (Black Diamond, Applied Material) and, furthermore a porous silica film having low dielectric constant. It is known that these Low-K film materials are strongly hydrophobic, and it has been reported in recent research that when a cleaning liquid having poor wettability toward the surface of a film is used in brush-cleaning, the brush-cleaning does not work effectively and the removal of particulate contamination is inadequate, and since the above-mentioned cleaning liquids have poor wettability toward the Low-K films, the films cannot be cleaned sufficiently. Under such circumstances, the present sinventors have proposed an aqueous solution containing an aliphatic polycarboxylic acid and a surfactant as a post-CMP cleaning liquid composition that has good wettability toward an interlayer insulating film formed from a Low-K film, etc., and can be used for the removal of particulate contamination and metallic contamination (Japanese Patent Application 2002-41393).

However, in subsequent research it has been found that, depending on the combination of the surfactant and the Low-K film, there is the defect that the surfactant might be adsorbed on the surface of the Low-K film or penetrate the Low-K film, thus damaging the Low-K film such as, for example, changing the refractive index.

Moreover, as an analogous organic acid-containing composition, a composition containing an organic acid, water, and an organic solvent has been disclosed (JP, A, 2002-206709), and after the application of the present invention, a composition containing an organic acid, water, an organic solvent and an anticorrosive has been disclosed (US2003/0130147A1). However, these techniques relate to a resist stripping agent, and post-CMP removal of particulate contamination and metallic contamination has not been disclosed.

Furthermore, after the application of the present invention, a cleaning liquid composition for semiconductor substrate having a Low-K film, containing an organic acid, water, and an ethylene-oxide-type surfactant as essential components, which may further contain alkyl alcohol has been disclosed (WO03/065433A1). However, all the examples are compounds containing an organic acid, water and a surfactant, and they have a possibility to damage Low-K films similar to those disclosed in Japanese Patent Application 2002-41393.

BRIEF SUMMARY OF THE INVENTION

It is therefore an object of the present invention to provide a cleaning liquid composition used for cleaning a semiconductor substrate, the cleaning liquid composition being capable of removing particulate contamination and metallic contamination from the surface of the semiconductor substrate without damaging the substrate even when the substrate is a hydrophobic substrate such as bare silicon or a Low-K film, and to provide a cleaning method using the composition.

As a result of an intensive investigation by the present inventors in order to solve the above-mentioned problems, it has been found that, although brush-cleaning is generally employed as post-CMP cleaning, when the wettability of the liquid toward the film surface is poor, brushing does not work effectively and the removal of particles is insufficient, and it is necessary for the contact angle between the cleaning liquid and the film to be a predetermined angle or below in order for the effect of brushing to work. As a result of a further investigation based on these findings, it has been found that a cleaning liquid composition consisting of an aliphatic polycarboxylic acid such as oxalic acid, when being used in combination with a specific organic solvent represented by Formula [1], reduces the contact angle relative to the surface of a hydrophobic substrate, exhibits good wettability and, consequently, greatly improves the ease of removal of metallic impurities and particles, compared with that without an organic solvent; and the present invention has thus been accomplished.

That is, the present invention relates to a cleaning liquid composition used for cleaning a semiconductor substrate having a contact angle between the surface thereof and water dropped thereon of at least 70 degrees, the cleaning liquid composition consisting of one or more types of organic solvent selected from the group consisting of compounds represented by Formula [1],

$R^1-O-(-R^2-O-)_n-R^3$         [1]

($R^1$ is an alkyl group having 1 to 6 carbons, $R^2$ is an ethylene group or a propylene group, n is 0 to 4, and $R^3$ is hydrogen or an alkyl group having 1 to 6 carbons), and an aliphatic polycarboxylic acid and water, wherein the contact angle of the cleaning liquid composition is at most 40 degrees when dropped on the semiconductor substrate.

Moreover, the present invention relates to the above-mentioned cleaning liquid composition wherein the semiconductor substrate is bare silicon or a semiconductor substrate having a low dielectric constant (Low-K) film.

Furthermore, the present invention relates to the above-mentioned cleaning liquid composition wherein the aliphatic polycarboxylic acid is one or more types selected from the group consisting of oxalic acid, malonic acid, malic acid, tartaric acid, and citric acid.

Moreover, the present invention relates to the above-mentioned cleaning liquid composition wherein the aliphatic polycarboxylic acid is contained at 0.01 to 30 wt %.

Furthermore, the present invention relates to the above-mentioned cleaning liquid composition wherein the organic solvent is contained at 0.01 to 50.0 wt %.

Furthermore, the present invention relates to the above-mentioned cleaning liquid composition wherein an anionic surfactant is further contained.

Moreover, the present invention relates a method for cleaning a semiconductor substrate having a contact angle between the surface thereof and water dropped thereon of at least 70 degrees, the method comprising cleaning by means of a cleaning liquid composition consisting of one or more types of organic solvent selected from the group consisting of compounds represented by Formula [1],

$R^1-O-(-R^2-O-)-R^3$         [1]

($R^1$ is an alkyl group having 1 to 6 carbons, $R^2$ is an ethylene group or a propylene group, n is 0 to 4, and $R^3$ is hydrogen or an alkyl group having 1 to 6 carbons), and an aliphatic polycarboxylic acid and water., wherein the contact angle of the cleaning liquid composition is at most 40 degrees when dropped on the semiconductor substrate.

Moreover, the present invention relates to the above-mentioned cleaning method wherein the semiconductor substrate is bare silicon or a semiconductor substrate having a low dielectric constant (Low-K) film.

Furthermore, the present invention relates to the above-mentioned cleaning method wherein the aliphatic polycarboxylic acid is one or more types selected from the group consisting of oxalic acid, malonic acid, malic acid, tartaric acid, and citric acid.

Moreover, the present invention relates to the above-mentioned cleaning method wherein the aliphatic polycarboxylic acid is contained at 0.01 to 30 wt %.

Furthermore, the present invention relates to the above-mentioned cleaning method wherein the organic solvent is contained at 0.01 to 50.0 wt %.

Furthermore, the present invention relates to the above-mentioned cleaning method wherein an anionic surfactant is further contained in the cleaning liquid composition.

The cleaning liquid composition of the present invention can be applied, with regard to a hydrophobic semiconductor substrate surface having a contact angle between the surface and water dropped thereon of at least 70 degrees, to the surface of a hydrophobic substrate such as post-CMP bare silicon or a Low-K film as a cleaning liquid for removing particulate contamination and metallic contamination from the surface without causing any damage to the surface. The cleaning liquid composition of course has good wettability toward the surface of a hydrophobic substrate such as bare silicon or a Low-K film, but the wettability toward the surface of a conventional semiconductor substrate is even better, and the cleaning liquid composition of the present invention can naturally be used as a post-CMP cleaning agent for the conventional semiconductor substrate.

Moreover, the cleaning liquid composition of the present invention can be used particularly effectively in brush-cleaning for removing particulate contamination.

Modes for carrying out the present invention are explained below.

DETAILED DESCRIPTION OF THE INVENTION

The present invention typically provides a cleaning liquid composition having excellent cleaning performance for post-CMP particulate contamination. That is, the present invention relates to a cleaning liquid containing an aliphatic polycarboxylic acid and an organic solvent having a hydroxyl group and/or an ether group.

Specifically, the cleaning liquid composition of the present invention is an aqueous solution prepared by adding an aliphatic polycarboxylic acid and an organic solvent having a hydroxyl group and/or an ether group to water as a solvent.

As the aliphatic polycarboxylic acid used in the present invention there are dicarboxylic acids such as oxalic acid and malonic acid, and oxypolycarboxylic acids such as tartaric acid, malic acid, and citric acid. In particular, oxalic acid is preferable as the polycarboxylic acid used in the present invention since it has a high ability to remove metallic impurities.

The concentration of the aliphatic polycarboxylic acid in the cleaning liquid is 0.001 to 30 wt %, and particularly preferably 0.03 to 10 wt %.

When the concentration of the aliphatic polycarboxylic acid is too low, the cleaning effect cannot be exhibited sufficiently, and when the concentration is too high, an effect proportional to the concentration cannot be expected and there is also the possibility that crystals might be precipitated. The concentration is therefore determined appropriately while taking into consideration the solubility of the aliphatic polycarboxylic acid.

Furthermore, as the organic solvent having a hydroxyl group and/or an ether group used in the present invention, those represented by Formula [1] below are expected to exhibit an excellent effect.

 [1]

($R^1$ is an alkyl group having 1 to 6 carbons, $R^2$ is an ethylene group or a propylene group, n is 0 to 4, and $R^3$ is hydrogen or an alkyl group having 1 to 6 carbons.)

Specific examples include aliphatic lower alcohols such as 1-propanol, 2-propanol, and 1-butanol, and polyhydric alcohol derivatives such as ethylene glycol monoethyl ether, ethylene glycol mono-n-propyl ether, ethylene glycol mono-n-butyl ether, diethylene glycol monomethyl ether, diethylene glycol monoethyl ether, diethylene glycol mono-n-butyl ether, diethylene glycol monoisobutyl ether, diethylene glycol mono-n-hexyl ether, diethylene glycol dimethyl ether, diethylene glycol diethyl ether, propylene glycol monomethyl ether, propylene glycol monoethyl ether, propylene glycol mono-n-propyl ether, propylene glycol mono-n-butyl ether, ethylene glycol mono-n-hexyl ether, triethylene glycol mono-n-hexyl ether, triethylene glycol mono-n-butyl ether, and triethylene glycol monoisobutyl ether.

In addition thereto, the examples further include compounds such as triethylene glycol dialkyl ethers, tetraethylene glycol mono- or di-alkyl ethers, dipropylene glycol mono- or di-alkyl ethers, tripropylene glycol mono- or di-alkyl ethers, and tetrapropylene glycol mono- or di-alkyl ethers.

Among these examples, those in which n is 2 or 3, $R^1$ has 4 to 6 carbons, and $R^3$ is hydrogen in Formula [1] are effective at a low concentration and are particularly preferable.

Moreover, a cleaning liquid composition having a better effect than that of a cleaning liquid composition containing only one of the particularly preferred organic solvents can be obtained by employing particularly preferred organic solvents in combination or by combining the particularly preferred organic solvents with an organic solvent that is represented by Formula [1] but is not included in the particularly preferred organic solvents.

For example, diethylene glycol mono-n-hexyl ether, in which $R^1$ has 6 carbons, exhibits excellent abrasive particle removal because of the alkyl group $R^1$ being large, but when it is used alone, the solubility in water is poor because of the size of alkyl group $R^1$, and since it can be dissolved only up to 1.0 wt % reduction of the contact angle is limited. However, by combining it with diethylene glycol mono-n-butyl ether or ethylene glycol mono-n-butyl ether, even when the concentration of the organic solvent is low, the contact angle can be further decreased while maintaining the excellent performance in removing abrasive particles.

Furthermore, a combination of two or more types of the organic solvents of Formula [1] can be used, and it is also possible to use at least one type of the organic solvent of Formula [1] in combination with at least one type of organic solvent that is not included in Formula [1].

The concentration of the organic solvent having a hydroxyl group and/or an ether group is 0.01 to 50 wt %, and particularly preferably 0.1 to 30 wt %. When the concentration of the organic solvent having a hydroxyl group and/or an ether group is low, it is not possible to make the contact angle 40° or below and the ability to remove particles is inadequate. When the concentration thereof is too high, an effect proportional to the concentration cannot be expected, and there is the possibility that a Low-K film might be damaged.

An anionic surfactant can be further added to the cleaning liquid composition of the present invention. With the addition of the anionic surfactant, zeta potential of particles and a substrate can be controlled and particles can be easily removed. At present, surfactants which are confirmed to have a possibility to damage Low-K films are those having a polyoxyethylene structure within a molecule, and they correspond to most of the nonionic surfactants and a part of the anionic surfactants. Anionic surfactants without a polyoxyethylene structure are considered not to damage Low-K films.

Anionic surfactants which can be used in the present invention include condensates of naphthalenesulfonic acid and formaldehyde, polyacrylic acid, polyvinyl sulfonic acid, polystyrene sulfonic acid, and the salts thereof.

The present invention is explained in detail below by reference to Examples of the present invention together with Comparative Examples, but the present invention is not limited by these examples.

EXAMPLES

Cleaning liquid compositions having the compositions shown in Table 1 to Table 3 were prepared using water as a solvent, and were used for measurement of the contact angle, the cleaning power, and the refractive index.

Contact Angle with Surface of Hydrophobic Substrate 1: Bare Silicon

The contact angle when dropped on the surface of a bare silicon substrate was measured using a contact angle measurement instrument, the wettability toward the substrate was evaluated, and the results are given in Table 1.

TABLE 1

| | Polycarboxylic acid (wt %) | | Organic solvent (wt %) | | Contact angle (°) |
|---|---|---|---|---|---|
| Comp. Ex. 1 | Oxalic acid | 0.068 | None | | 67.9 |
| Comp. Ex. 2 | | | Ethylene glycol | 30.0 | 46.7 |
| Comp. Ex. 3 | | | γ-Butyrolactone | 10.0 | 53.0 |
| Example 1 | Oxalic acid | 0.068 | Ethylene glycol monoethyl ether | 30.0 | 14.8 |
| Example 2 | | | Diethylene glycol monoethyl ether | 30.0 | 17.2 |
| Example 3 | | | Propylene glycol mono-n-propyl ether | 10.0 | 30.5 |
| Example 4 | Oxalic acid | 0.34 | Triethylene glycol mono-n-butyl ether | 3.0 | 36.0 |
| Example 5 | Oxalic acid | 3.4 | Diethylene glycol mono-n-butyl ether | 3.0 | 29.2 |
| Example 6 | | | Diethylene glycol mono-n-hexyl ether | 0.5 | 32.0 |

Contact Angle with Surface of Hydrophobic Substrate 2:
Organic Film (SiLk)

The contact angle when dropped on the surface of SiLk (manufactured by The Dow Chemical Company), which is an organic Low-K film, was measured using a contact angle measurement instrument, the wettability toward the substrate was evaluated, and the results are given in Table 2.

TABLE 2

| | Polycarboxylic acid (wt %) | | Organic solvent (wt %) | | Contact angle (°) |
|---|---|---|---|---|---|
| Comp. Ex. 4 | Oxalic acid | 0.34 | None | | 82.1 |
| Comp. Ex. 5 | | | Ethylene glycol | 30.0 | 61.6 |
| Comp. Ex. 6 | | | N-Methyl-2-pyrrolidinone | 30.0 | 53.9 |
| Comp. Ex. 7 | Malonic acid | 0.068 | None | | 82.0 |
| Example 7 | Oxalic acid | 0.34 | Triethylene glycol monoisobutyl ether | 5.0 | 39.8 |
| Example 8 | | | Diethylene glycol mono-n-butyl ether | 5.0 | 30.6 |
| Example 9 | | | Propylene glycol mono-n-propyl ether | 10.0 | 33.1 |
| Example 10 | | | Ethylene glycol monoethyl ether | 30.0 | 32.0 |
| Example 11 | Oxalic acid | 3.4 | Diethylene glycol monoisobutyl ether | 5.0 | 34.4 |
| Example 12 | | | Diethylene glycol mono-n-hexyl ether | 1.0 | 6.1 |
| Example 13 | Malonic acid | 0.068 | Diethylene glycol mono-n-hexyl ether | 1.0 | 8.9 |

Contact Angle with Surface of Hydrophobic Substrate 3:
Silicon-based Low-K Film (SiOC)

The contact angle when dropped on the surface of Black Diamond (SiOC, manufactured by The Applied Material Company), which is a silicon-based Low-K film, was measured using a contact angle measurement instrument, the wettability toward the substrate was evaluated, and the results are given in Table 3.

TABLE 3

| | Polycarboxylic acid (wt %) | | Organic solvent (wt %) | | Contact angle (°) |
|---|---|---|---|---|---|
| Comp. Ex. 8 | Oxalic acid | 3.4 | None | | 96.0 |
| Comp. Ex. 9 | | | N-Methyl-2-pyrrolidinone | 96.6 | 46.6 |
| Example 14 | Oxalic acid | 3.4 | 2-Propanol | 30.0 | 35.7 |
| Example 15 | | | Diethylene glycol monoisobutyl ether | 30.0 | 35.5 |
| Example 16 | | | Diethylene glycol mono-n-hexyl ether | 1.0 | 36.3 |
| Example 17 | | | Diethylene glycol mono-n-butyl ether | 4.0 | 28.2 |
| | | | Diethylene glycol mono-n-hexyl ether | 1.0 | |

As hereinbefore described, the cleaning liquid compositions of the present invention have improved wettability toward various types of hydrophobic surfaces.

Removal of Particles

Bare silicon wafers were immersed in a slurry containing silica particles, the wafers thus contaminated with the silica particles were cleaned, and the removal of particles was evaluated. Particles having a size of 0.13 µm or above were counted.

Slurry immersion time: 30 sec.

Cleaning conditions: 25° C., 20 sec. (brush-cleaning)

Initial level of silica particulate contamination: 30,000 particles per wafer

TABLE 4

| | Number of particles after cleaning | Percentage removal (%) |
|---|---|---|
| Comp. Ex. 1 | 6,000 | 80.0 |
| Example 2 | 1,500 | 95.0 |
| Example 5 | 600 | 98.0 |

Removal of Metals

Silicon wafers were cleaned with a liquid mixture of aqueous ammonia (29 wt %)—aqueous hydrogen peroxide (30 wt %)—water (volume ratio 1:1:6), and then contaminated with iron, copper, zinc, and nickel at a surface concentration of $10^{13}$ atoms/cm$^2$ by a spin coating method. The wafers were cleaned with the cleaning liquids of the Example and the Comparative Example at 25° C. for 3 minutes, rinsed with running ultrapure water for 3 minutes, and then dried. The metal concentration on the surface of the wafers was measured using a total reflection X-ray fluorescence spectrometer, and the removal of metals was evaluated.

TABLE 5

| | Surface metal concentration (×10$^{10}$ atoms/cm$^2$) | | | |
| --- | --- | --- | --- | --- |
| | Cu | Fe | Ni | Zn |
| Before cleaning | 2,900 | 3,000 | 2,600 | 2,500 |
| Comp. Ex. 1 | 0.4 | 1.2 | 1.7 | 4.0 |
| Example 5 | 0.2 | 3.8 | 1.4 | 4.2 |

Damage to Low-K Film

Silicon wafers having porous MSQ as a Low-K film were immersed in the cleaning liquids of the Comparative Example and the Example at 25° C. for 10 minutes, rinsed with running ultrapure water (3 minutes), and then dried. The refractive index of the Low-K film before and after the immersion was measured using a NanoSpec 210 instrument (manufactured by Nanometrics Inc.). The refractive index and the permittivity are interrelated, and the higher the refractive index, the higher the permittivity.

TABLE 6

| | Constituents (wt %) | | Refractive index | |
| --- | --- | --- | --- | --- |
| Comp. Ex. 10 | Oxalic acid Surfactant Newcol 565* | 3.4 0.03 | Before immersion After immersion | 1.258 1.409 |
| Example 5 | Oxalic acid Diethylene glycol mono-n-butyl ether | 3.4 3.0 | Before immersion After immersion | 1.258 1.258 |

*Polyoxyalkylene alkyl phenyl ether (nonionic surfactant, manufactured by Nippon Nyukazai Co., Ltd.)

As hereinbefore described, the cleaning liquid compositions of the present invention have improved wettability toward the surface of a hydrophobic substrate such as a Low-K film, etc. and exhibit excellent performance in removing particles and metallic impurities adsorbed on the surface, without damaging the film.

What is claimed is:

1. A method for cleaning a semiconductor substrate, wherein the semiconductor substrate is a bare silicon polished and planarized by means of a chemical-mechanical polishing technique or a semiconductor substrate having a low dielectric constant (Low-K) film, and has a contact angle between a surface thereof and water dropped thereon of at least 70 degrees, the method comprising contacting the semiconductor substrate with a cleaning liquid composition which contact angle is at most 40 degrees when dropped on the semiconductor substrate, and removing particulate contamination and metallic contamination from the surface of the semiconductor substrate, said cleaning composition consisting of one or more types of organic solvent selected from the group consisting of compounds represented by Formula [1], $$R^1\text{—O—}(R^2\text{—O})_n\text{—}R^3 \qquad [1]$$

wherein $R^1$ is an alkyl group having 4 to 6 carbons, $R^2$ is an ethylene group or a propylene group, n is 2 to 3, and $R^3$ is hydrogen, an aliphatic polycarboxylic acid, an anionic surfactant selected from condensates of naphthalenesulfonlc acid and formaldehyde, polyacrylic acid, polyvinyl sulfonic acid, polystyrene sulfonic acid and the salts thereof, and water.

2. The cleaning method according to claim 1, wherein the organic solvent is contained at 0.01 to 50.0 wt %.

* * * * *

UNITED STATES PATENT AND TRADEMARK OFFICE
CERTIFICATE OF CORRECTION

PATENT NO. : 7,503,982 B2  Page 1 of 1
APPLICATION NO. : 10/818033
DATED : March 17, 2009
INVENTOR(S) : Abe and Ishikawa It is certified that error appears in the above-identified patent and that said Letters Patent is hereby corrected as shown below:

On the Title of the patent in Section (73) Assignee:

Please delete "Kanto Jangaku Kabushiki Kaisha" and insert
--Kanto Kagaku Kabushiki Kaisha--.

Signed and Sealed this

Nineteenth Day of May, 2009

JOHN DOLL
*Acting Director of the United States Patent and Trademark Office*